(12) United States Patent
Ghoneim

(10) Patent No.: US 10,672,620 B2
(45) Date of Patent: Jun. 2, 2020

(54) HYBRID MASK FOR DEEP ETCHING

(71) Applicant: KING ABDULLAH UNIVERSITY OF SCIENCE AND TECHNOLOGY, Thuwal (SA)

(72) Inventor: Mohamed Tarek Ghoneim, Giza (EG)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 4 days.

(21) Appl. No.: 16/074,190

(22) PCT Filed: Jan. 26, 2017

(86) PCT No.: PCT/IB2017/050417
§ 371 (c)(1),
(2) Date: Jul. 31, 2018

(87) PCT Pub. No.: WO2017/134545
PCT Pub. Date: Aug. 10, 2017

(65) Prior Publication Data
US 2019/0385861 A1    Dec. 19, 2019

Related U.S. Application Data

(60) Provisional application No. 62/289,895, filed on Feb. 1, 2016.

(51) Int. Cl.
*H01L 21/308* (2006.01)
*H01L 21/027* (2006.01)
(Continued)

(52) U.S. Cl.
CPC ...... *H01L 21/3081* (2013.01); *H01L 21/0272* (2013.01); *H01L 21/0331* (2013.01);
(Continued)

(58) Field of Classification Search
CPC .................................................. H01L 21/308
See application file for complete search history.

(56) References Cited

U.S. PATENT DOCUMENTS

| | | | |
|---|---|---|---|
| 5,501,893 A | 3/1996 | Laermer et al. | |
| 2012/0115331 A1* | 5/2012 | Koh | H01L 21/0332 438/694 |

(Continued)

FOREIGN PATENT DOCUMENTS

| | | |
|---|---|---|
| EP | 0232894 A2 | 8/1987 |
| WO | 0179933 A1 | 10/2001 |

OTHER PUBLICATIONS

International Search Report in related PCT Application No. PCT/IB2017/050417, dated Jul. 21, 2017.

(Continued)

*Primary Examiner* — Marvin Payen
(74) *Attorney, Agent, or Firm* — Patent Portfolio Builders PLLC

(57) ABSTRACT

Deep reactive ion etching is essential for creating high aspect ratio micro-structures for microelectromechanical systems, sensors and actuators, and emerging flexible electronics. A novel hybrid dual soft/hard mask bilayer may be deposited during semiconductor manufacturing for deep reactive etches. Such a manufacturing process may include depositing a first mask material on a substrate; depositing a second mask material on the first mask material; depositing a third mask material on the second mask material; patterning the third mask material with a pattern corresponding to one or more trenches for transfer to the substrate; transferring the pattern from the third mask material to the second mask material; transferring the pattern from the second mask material to the first mask material; and/or transferring the pattern from the first mask material to the substrate.

20 Claims, 7 Drawing Sheets

(51) Int. Cl.
H01L 21/033 (2006.01)
H01L 21/768 (2006.01)
*H01L 21/56* (2006.01)
*H01L 23/00* (2006.01)

(52) U.S. Cl.
CPC ........ H01L 21/76898 (2013.01); *H01L 21/56* (2013.01); *H01L 24/03* (2013.01)

(56) References Cited

U.S. PATENT DOCUMENTS

| | | | | |
|---|---|---|---|---|
| 2014/0225233 | A1* | 8/2014 | Hirschler | .......... H01L 21/76898 257/643 |
| 2015/0380251 | A1* | 12/2015 | Glodde | ............. H01L 21/28123 438/591 |

OTHER PUBLICATIONS

Written Opinion of the International Searching Authority in related PCT Application No. PCT/IB2017/050417, dated Jul. 21, 2017.
Aachboun, S., et al., "Deep anisotropic etching of silicon," Journal of Vacuum Science & Technology A, vol. 17, No. 1, Jul./Aug. 1999, pp. 2270-2273 (5 pages provided).
Alfaraj, N., et al., "Functional integrity of flexible n-channel metal-oxide-semiconductor field-effect transistors on a reversibly bistable platform," Applied Physics Letters, vol. 107, 2015 (Published online Oct. 26, 2015), pp. 174101-1-174101-5 (6 pages provided).
Ayón, A.A., et al., "Anisotropic silicon trenches 300-500 μm deep employing time multiplexed deep etching (TMDE)," Sensors and Actuators A: Physical, vol. 91, Issue 3, Jul. 15, 2001, pp. 381-385.
Coburn, J.W., et al., "Conductance considerations in the reactive ion etching of high aspect ratio features," Applied Physics Letters, vol. 55, No. 26, Dec. 25, 1989, pp. 2730-2732 (4 pages provided).
Esashi, M., et al., "High-rate directional deep dry etching for bulk silicon micromachining," Journal of Micromechanics and Microengineering, vol. 5, 1995, pp. 5-10 (7 pages provided).
Ghoneim, M.T., et al., "Additive advantage in characteristics of MIMCAPs on flexible silicon (100) fabric with release-first process," Phys. Status Solidi. RRL, vol. 8, No. 2, 2014 (Published online Nov. 20, 2013), pp. 163-166.
Ghoneim, M.T., et al., "Electrical Analysis of High Dielectric Constant Insulator and Metal Gate Metal Oxide Semiconductor Capacitors on Flexible Bulk Mono-Crystalline Silicon," IEEE Transactions on Reliability, vol. 64, No. 2, Jun. 2015 (Date of Publication Nov. 26, 2014; Date of Current Version Jun. 1, 2015), pp. 579-585.
Ghoneim, M.T., et al., "Enhanced cooling in mono-crystalline ultra-thin silicon by embedded micro-air channels," AIP Advances, vol. 5, 2015 (Published online Dec. 11, 2015), pp. 127115-1-127115-12 (13 pages provided).
Ghoneim, M.T., et al., "Mechanical anomaly impact on metal-oxide-semiconductor capacitors on flexible silicon fabric," Applied Physics Letters, vol. 104, 2014 (Published online Jun. 10, 2014), pp. 234104-1-234104-4 (5 pages provided).
Ghoneim, M.T., et al., "Out-of-plane Strain Effect on Silicon-Based Flexible FinFETs," 2015 73rd Annual Device Research Conference (DRC), Jun. 21-24, 2015, pp. 95-96.
Ghoneim, M.T., et al., "Review on Physically Flexible Nonvolatile Memory for Internet of Everything Electronics," Electronics, vol. 4, Jul. 23, 2015, pp. 424-479.
Ghoneim, M.T., et al., "Study of harsh environment operation of flexible ferroelectric memory integrated with PZT and silicon fabric," Applied Physics Letters, vol. 107, 2015 (Published online Aug. 5, 2015), pp. 052904-1-052904-5 (6 pages provided).
Ghoneim, M.T., et al., "Thin PZT-Based Ferroelectric Capacitors on Flexible Silicon for Nonvolatile Memory Applications," Advanced Electronics Materials, vol. 1, Article 1500045, 2015 (Published online Apr. 24, 2015), pp. 1-10.
Shoneim, M.T., et al., "Towards neuromorphic electronics: Memristors on foldable silicon fabric," Microelectronics Journal, vol. 45, 2014 (Available online Sep. 4, 2014), pp. 1392-1395.
Hussain, A.M., et al., "CMOS-Technology-Enabled Flexible and Stretchable Electronics for Internet of Everything Applications," Advanced Materials, vol. 28, 2016 (Published online Nov. 26, 2015), pp. 4219-4249.
Juan, W.-H., et al., "Released Si Microstructures Fabricated by Deep Etching and Shallow Diffusion," Journal of Microelectromechanical Systems, vol. 5, No. 1, Mar. 1996, pp. 18-23.
Kawata, H., et al., "Si Etching with High Aspect Ratio and Smooth Side Profile for Mold Fabrication," Japanese Journal of Applied Physics, vol. 45, No. 6B, 2006 (Published online Jun. 20, 2006), pp. 5597-5601 (6 pages provided).
Kiihamäki, J., "Deceleration of silicon etch rate at high aspect ratios," Journal of Vacuum Science & Technology A, vol. 18, No. 4, Jul./Aug. 2000, pp. 1385-1389 (6 pages provided).
Mukherjee, P., et al., "Fabrication of high aspect ratio Si nanogratings with smooth sidewalls for a deep UV-blocking particle filter," Journal of Vacuum Science & Technology B: Microelectronics and Nanometer Structures Processing, Measurement, and Phenomena, vol. 25, No. 6, Nov./Dec. 2007 (Published Dec. 11, 2007), pp. 2645-2648 (5 pages provided).
Pham, P.H., et al., "Fabrication and Characterization of Smooth Si Mold for Hot Embossing Process," IEEJ Transactions on Sensors and Micromachines, vol. 127, No. 3, Jun. 1, 2007, pp. 187-191 (6 pages provided).
Rojas, J.P., et al., "Design and characterization of ultra-stretchable monolithic silicon fabric," Applied Physics Letters, vol. 105, 2014 (Published online Oct. 13, 2014), pp. 154101-1-154101-5 (6 pages provided).
Rojas, J.P., et al., "Flexible High-k/Metal Gate Metal/Insulator/Metal Capacitors on Silicon (100) Fabric," IEEE Transactions on Electron Devices, vol. 60, No. 10, Oct. 2013 (Date of Publication Aug. 26, 2013; Date of Current Version Sep. 18, 2013), pp. 3305-3309.
Soggs, S., et al., "EE539A: Physics and Modeling of VLSI Fabrication," Jun. 13, 2003, 18 pages.
Song, I.-H., et al., "Smoothing dry-etched microstructure sidewalls using focused ion beam milling for optical applications," Journal of Micromechanics and Microengineering, vol. 17, Jul. 13, 2007, pp. 1593-1597 (6 pages provided).
Torres Sevilla, G.A., et al., "Flexible Nanoscale High-Performance FinFETs," ACS Nano, vol. 8, No. 10, 2014 (Published online Sep. 3, 2014), pp. 9850-9856.

* cited by examiner

308 — (Top sacrificial)
306 — (Hard Mask)
304 — (Bottom sacrificial)
302 — (Material to be Etched)

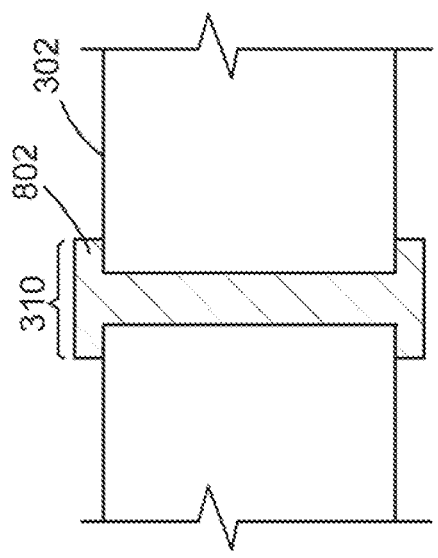
FIG. 8
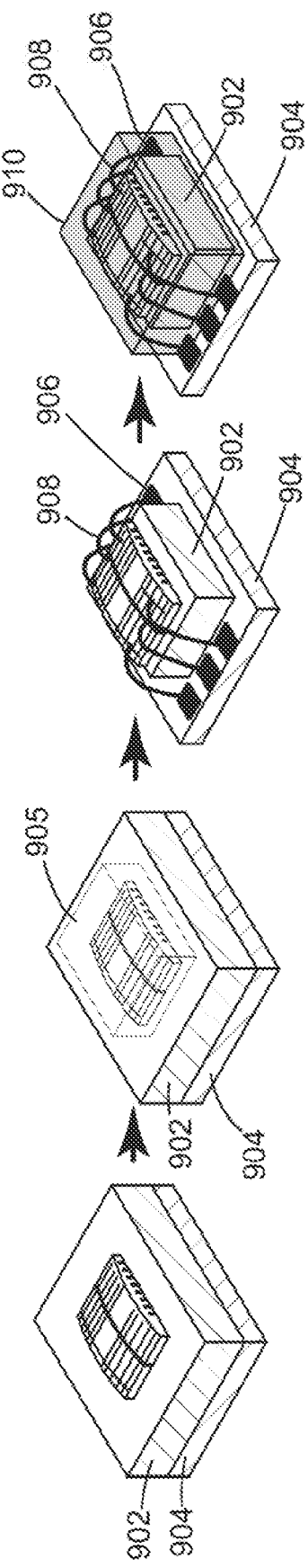
FIG. 9A
FIG. 9B
FIG. 9C
FIG. 9D

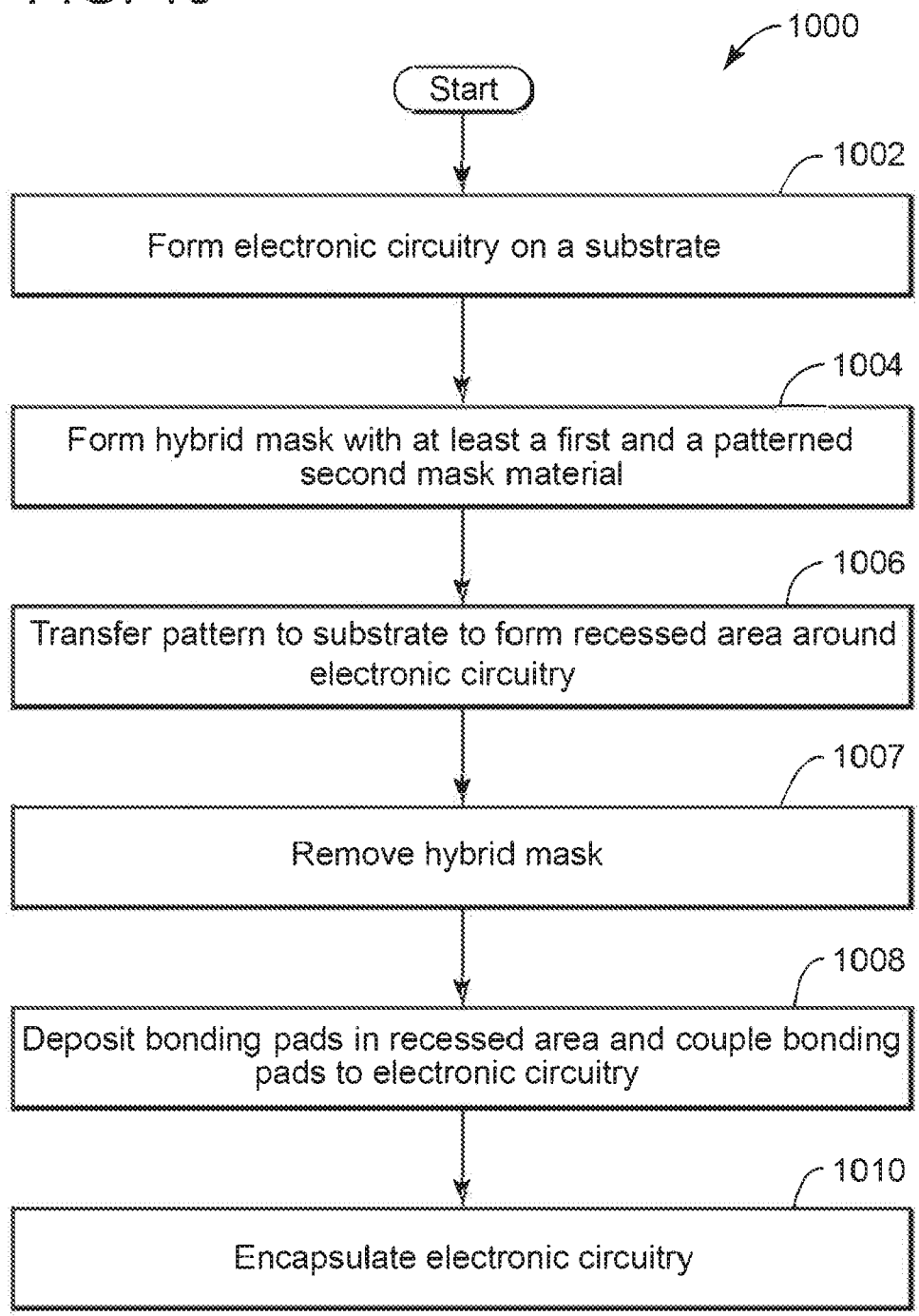

HYBRID MASK FOR DEEP ETCHING

CROSS-REFERENCE TO RELATED PATENT APPLICATIONS

None.

FIELD OF THE DISCLOSURE

The instant disclosure relates to semiconductor manufacturing. More specifically, portions of this disclosure relate to use a hybrid mask layer to allow deep etching through layers during a semiconductor manufacturing process.

BACKGROUND

Micromachining fabrication techniques are used in, for example, manufacturing microelectromechanical systems (MEMS), dynamic random access memory (DRAM) capacitors, through silicon vias (TSVs) for 3D packaging, and novel structures for the emerging Internet of Everything (IoE) free-form electronics. Conventional micromachining techniques include surface micromachining for structures that are a few microns deep and bulk micromachining for deeper structures. Bulk micromachining techniques have been used for making deep structures with high aspect ratio, fine features, and smooth sidewalls.

One bulk micromachining technique uses a hard mask material to withstand sustained deep reactive ion etching (DRIE) of patterns in a substrate. The hard mask material could be a metal, due to their inertness, or thin oxide layers. FIG. 1 is a cross-section showing conventional deep etching with a metal hard mask. A hard mask layer 104 is deposited on a substrate 102 and patterned. The pattern in the hard mask layer 104 is then transferred into the substrate 102. The obtainable depth of the pattern into the substrate is, in part, dependent upon the characteristics of the hard mask layer 104.

Another bulk micromachining technique involves the use of a soft mask layer. FIG. 2 is a cross-section showing conventional deep etching with a soft hard mask. A soft mask layer 204, such as a photoresist layer or one or more other organic materials or non-metallic materials, is deposited on the substrate 102 and patterned. The pattern of the soft mask layer 204 is then transferred into the substrate 102. Photoresist (PR) and other soft materials are generally not suitable masks for DRIE processes. One such soft mask layer 204 may include a bilayer of oxide and photoresist and used for 300 µm deep etches. For tens of microns deep etches, photoresist masks may be sufficient. However, deeper trenches, such as for stretchable electronics where etching goes through the entire thickness of a silicon wafer, requires a hard mask of, for example, a Titanium/Gold bilayer.

The use of hard masks in deep etches (e.g., 100's of microns) imposes some limitations, especially for the semiconductor industry. The first challenge is the choice of the hard mask material. The DRIE time is affected, in part, by the depth of the trenches and the lateral dimensions due to the micro loading effect. The micro loading effect causes etching rate dependence such that narrower trenches would need more time to reach desired depth than wider features. This is explained by the effect of feature dimensions on trench conductance. The feature conductance is a measure of how easily reaction by-products can be vented and reactant gases can be supplied for more etching. As the trench depth (and aspect ratio) increases, the collisions between the leaving and entering gases increase, resulting in a dropping of the etch rate. Micro-loading results due to drop in feature conductance and narrower features suffer more because of the relative difficulty inherent in a smaller outlet/inlet trench.

The hard mask needs to be selective to the extremely long DRIE process, such that the mask is not etched during the process and at the same time the hard mask needs to be easily removed after the deep etch is performed. For instance, nickel is one conventional hard mask that supports deep etching, but nickel is difficult to remove using dry etching techniques. Further, nickel, and other metals, can bond with other materials used during the semiconductor manufacturing process and alter their chemistry. For example, nickel forms NiSi with silicon substrates when exposed to high temperatures. Alternatively, gold can be used as a hard mask, but gold does not adhere well to silicon and requires an underlying titanium layer for adhesion. Titanium readily oxidizes in air and is also hard to remove using dry etching. Alternatively, aluminum can be easily etched using metal RIE in halide gases, but aluminum forms alloys with silicon at the interface. One alternative to dry etching is wet etching. But, wet etching involves immersing the whole wafer causing contamination and selectivity issues that would not be suitable for complementary metal-oxide-semiconductor (CMOS) process flows, especially at an advanced stage after the devices are fabricated.

Another issue with the use of hard masks is the deposition method, which is sputtering in most cases. The metal/silicon interface is degraded due to ion bombardment during the deposition or diffusion (if alternative deposition methods, such as atomic layer deposition, are used at elevated temperature). Finally, even dry etching of a hard mask involves plasma and DC power that can detrimentally affect the surface roughness of the silicon or underlying material interface, which is also undesirable for MEMS manufacturing. Thus, conventional manufacturing techniques for deep etching present many challenges when using either hard masks or soft masks.

SUMMARY

A hybrid dual soft/hard mask layer may be used to obtain some of the benefits of soft mask layers and some of the benefits of hard mask layers, while overcoming some of the challenges for deep etching of structures, including those of tens or hundreds of microns thick. The hybrid mask layer may include a hard mask layer above a soft mask layer. The hard mask layer may provide a desirable etch selectivity, such that deep structures may be manufactured using a relatively thin hard mask layer to create high aspect ratio structure. The soft mask layer under the hard mask layer may be used as a buffer to prevent undesirable chemical reactions between the hard mask layer and the underlying semiconductor structure. The soft mask layer may also be used as a sacrificial layer to allow easy removal of the hard mask layer by dissolving the soft mask layer to release the hard mask layer.

The processes involving the hybrid mask layer is generic and various sacrificial layers (such as amorphous Si, poly Si, dielectrics, polymers, etc.) and hard masks (Ni, dielectrics, Cu, Au, Pt, etc.) can be used. The disclosed processes have little or no effect on the surface of the material under the hybrid mask, prevents diffusion and alloy formation between hard mask and underlying layers, and/or avoids the abrasive etching of the hard mask after DRIE.

According to one embodiment, a manufacturing process may include depositing a first mask material on a substrate;

depositing a second mask material on the first mask material; depositing a third mask material on the second mask material; patterning the third mask material with a pattern corresponding to one or more trenches for transfer to the substrate; transferring the pattern from the third mask material to the second mask material; transferring the pattern from the second mask material to the first mask material; and/or transferring the pattern from the first mask material to the substrate.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 8 is a cross-section showing a through silicon via (TSV) that may be manufacturing using deep etching provided by a hybrid hard/soft mask according to one embodiment of the disclosure.

FIGS. 9A-9D are illustrations showing a method of encapsulating electronics using deep etching provided by a hybrid hard/soft mask according to one embodiment of the disclosure.

FIG. 10 is a flow chart showing a method of preparing electronic device dies using deep etching provided by a hybrid hard/soft mask according to one embodiment of the disclosure.

DETAILED DESCRIPTION

Figure 1:
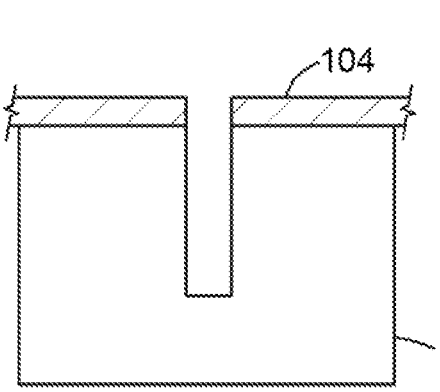
FIG. 1 is a cross-section showing conventional deep etching with a metal hard mask.
Figure 2:
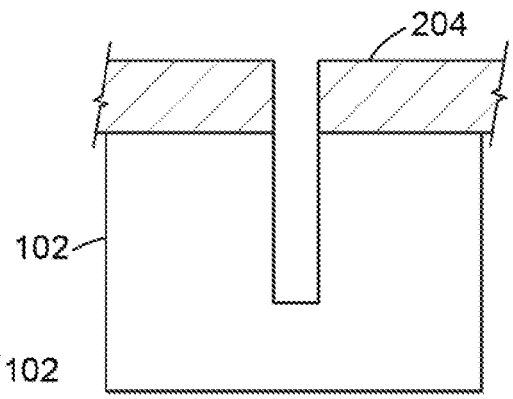
FIG. 2 is a cross-section showing conventional deep etching with a soft hard mask.
Figure 3A:
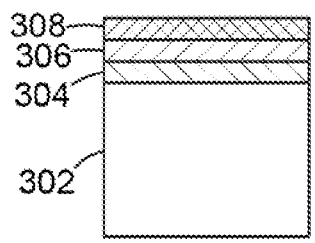
FIGS. 3A-3F are cross-sections showing a method of deep etching using a hybrid hard/soft mask according to one embodiment of the disclosure.

FIGS. 3A-3F are cross-sections showing a method of deep etching using a hybrid hard/soft mask according to one embodiment of the disclosure. FIG. 3A shows a hybrid mask after deposition of layers on a semiconductor structure, such as a semiconductor substrate. A first soft mask layer 304 may be deposited on substrate 302. A hard mask layer 306 may be deposited on the first soft mask layer 304, and a second soft mask layer 306 may be deposited on the hard mask layer 306. The soft mask layer 304 and the hard mask layer 306 may form a hybrid hard/soft bilayer mask.

Figure 3B:
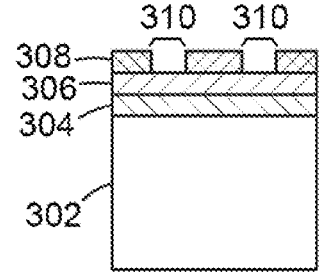
Figure 3C:
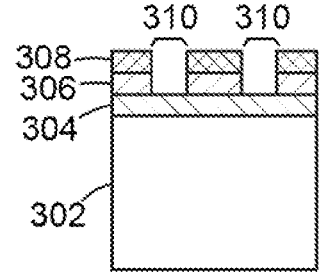

FIG. 3B shows the structure of FIG. 3A after patterning of the second soft mask layer 308. The second soft mask layer 308 may be used to pattern a desired structure into the hard mask layer 306. Openings 310 may be patterned in the second soft mask layer 308, in which the openings 310 correspond to trenches or other structures to replicate in lower layers such as the substrate 302. The pattern 310 may include one or more trenches, such as those used to form through silicon vias (TSVs) or encapsulation of electronics formed on the substrate 302.

Figure 3D:
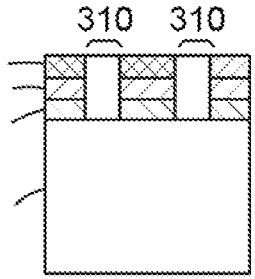
Figure 3E:
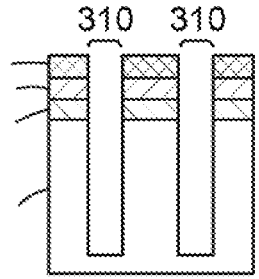
Figure 3F:
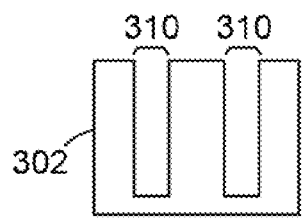

The pattern 310 may be transferred to lower layer hard mask layer 306 as shown in FIG. 3C and again transferred to lower layer soft mask layer 304 as shown in FIG. 3D. The pattern 310 may then be transferred to the substrate 302 as shown in FIG. 3E. The transfer may etch through some or all of the semiconductor structure below the first soft mask layer 304. Then, the hybrid mask may be stripped from the substrate 302 as shown in FIG. 3F. The hybrid mask may be removed by dissolving the soft mask layer 304, such that the hard mask layer 306 and any remaining second soft mask layer 308, is released from the substrate 302. The soft mask layer 304 is generally easier to remove than the hard mask layer 306 and leaves the surface of substrate 302 with less change. However, the hard mask layer 306 provides better functionality as a mask layer for deep etching through semiconductor structures, such as substrate 302. Thus, by combining the soft mask layer 304 and hard mask layer 306, a hybrid mask provides many of the benefits of both the soft mask layer 304 and the hard mask layer 306, while reducing the disadvantages of each.

Figure 4:
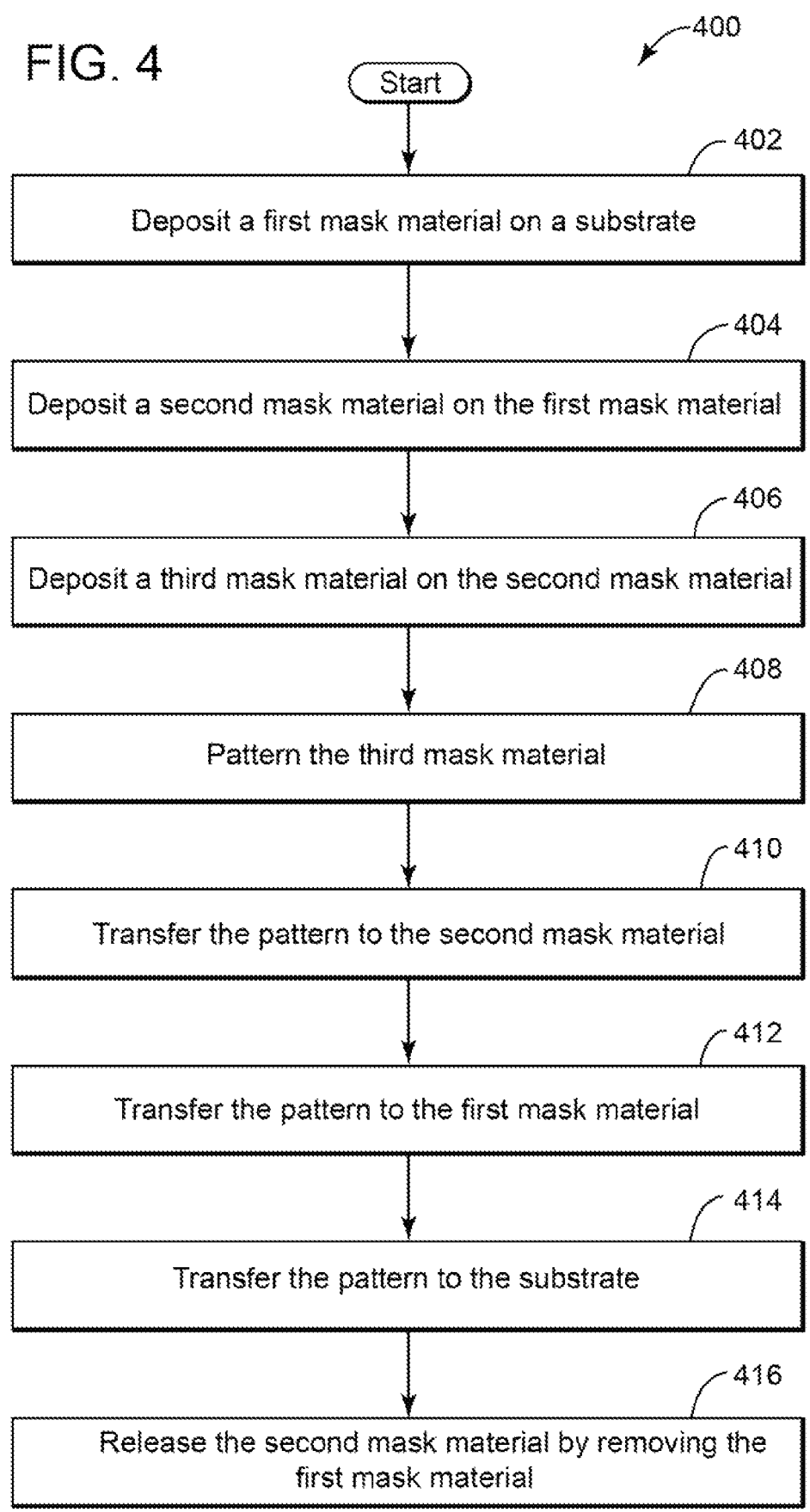
FIG. 4 is a flow chart showing a method of deep etching features in one or more layers of a semiconductor structure using a hybrid hard/soft mask according to one embodiment of the disclosure.

One semiconductor manufacturing process using a hybrid mask for deep etching is described with reference to FIG. 4. FIG. 4 is a flow chart showing a method of deep etching features in one or more layers of a semiconductor structure using a hybrid hard/soft mask according to one embodiment of the disclosure. A method 400 begins at block 402 with depositing a first mask material on a substrate. Then, at block 404, a second mask material is deposited on the first mask material. Next, at block 406, a third mask material is deposited on the second mask material. The mask materials of 402, 404, and 406 may be the soft mask layer 304, the hard mask layer 306, and the soft mask layer 308 shown in FIGS. 3A-3F.

With the hybrid mask layers deposited, the layers may then be patterned and the pattern transferred to semiconductor structures below the hybrid mask. At block 408, the third mask material is patterned, and that pattern transferred to the second mask material at block 410 and then to the first mask material at block 412. The patterning at block 408 may include exposing the third mask material through a photomask and developing the third mask material to form a physical pattern corresponding to the pattern on the photomask. The transfer of blocks 410 and 412 may include etching through the first and second mask material, such as by sputter etching or reactive ion etching (RIE). The pattern may be transferred to the hybrid mask layers, including the first mask material and the second mask material, by using the third mask material as a mask for the etching process.

After the pattern is transferred to the hybrid mask, semiconductor structures below the hybrid mask may be etched. For example, at block 414, the pattern of the hybrid mask may be transferred to the substrate by deep etching through the substrate using the hybrid mask as an etch mask. The deep etch may create openings the substrate that extend the entire length of the substrate and emerge on the other side to allow interconnecting of electronics on both sides of the substrate. The hard mask material of the hybrid mask allows the deep etching to form high aspect ratio structures in the semiconductor layers. The soft mask material of the hybrid mask reduces or prevents contamination of the surface of the semiconductor layers by the hard mask material. After transferring the pattern to the semiconductor layers, the second mask material may be released by removing the first mask material. For example, the soft mask material may be dissolved in a solvent or developer and any remaining structures above the soft mask material are then released from the semiconductor structure.

Figures 5A, 5B, 5C, 5D:
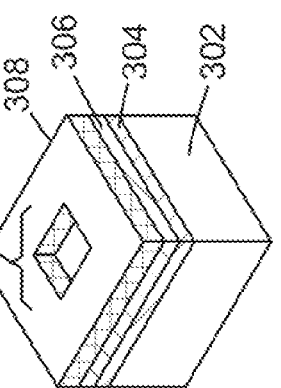
FIGS. 5A-5H are illustrations showing a method of deep etching using a hybrid hard/soft mask with a metal and a negative-tone photoresist according to one embodiment of the disclosure.
Figures 5E, 5F, 5G, 5H:
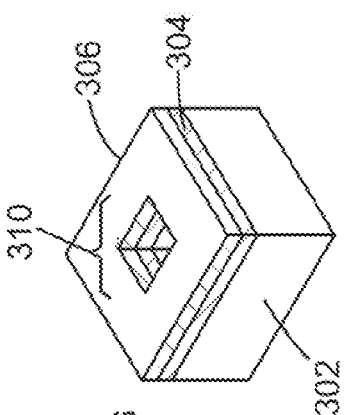
Figure 6:
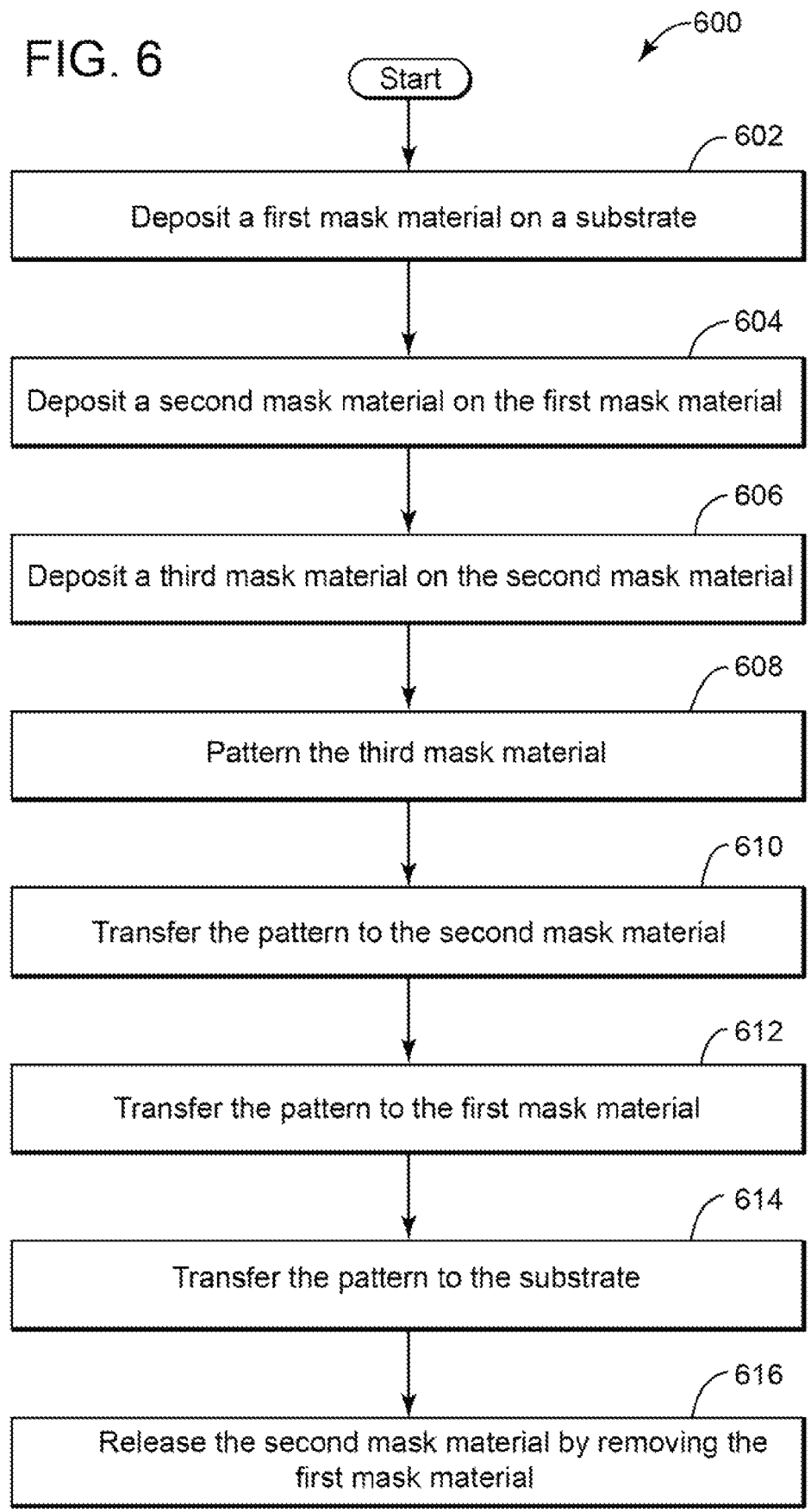
FIG. 6 is a flow chart showing a method of deep etching using a hybrid hard/soft mask with a metal and a negative-tone photoresist according to one embodiment of the disclosure.

One application of the semiconductor manufacturing process described with reference to FIGS. 3-4 is described with reference to FIGS. 5-6. The process of FIGS. 5-6 will be described involving specific materials selections and etching chemistries. However, embodiments of the manufacturing process described with reference to FIGS. 3-4 may involve many other materials and processes. FIGS. 5A-5H are illustrations showing a method of deep etching using a hybrid hard/soft mask with a metal and a negative-tone photoresist according to one embodiment of the disclosure. FIG. 6 is a flow chart showing a method of deep etching using a hybrid hard/soft mask with a metal and a negative-tone photoresist according to one embodiment of the disclosure.

Referring to FIG. 6, a method 600 begins with forming the hybrid mask on a semiconductor structure. Initially, at block 602, a negative-tone photoresist is deposited as a first mask material on a semiconductor substrate, such as a silicon substrate. FIG. 5A shows a silicon wafer 302, and FIG. 5B shows the silicon wafer 302 after spinning on an AZ-5214 negative-tone photoresist first mask layer 304. At block 604, the negative-tone photoresist is flood exposed under an appropriate light source with no photomask, resulting in exposure of the entire layer 304. Next, at block 606, an aluminum metal layer is deposited on the negative-tone photoresist. FIG. 5C shows the aluminum layer second mask layer 306 deposited on the first mask layer 302. Then at block 608, a positive-tone photoresist is deposited as the third mask layer on the second mask layer. FIG. 5D shows the ECI-3027 positive-tone photoresist third mask layer 308 on the second mask layer 306. The third mask layer may serve as a mask for patterning the hybrid mask including the negative-tone photoresist layer and the aluminum layer.

After the hybrid mask is formed, a pattern may be formed in the hybrid mask and the hybrid mask used to transfer the pattern to the semiconductor structure. At block 610, the positive-tone photoresist may be patterned by exposing the photoresist to an appropriate light source through a photomask and developing the photoresist. FIG. 5D shows a pattern feature 310 formed in the photoresist third mask layer 308. Then, at block 612, the pattern may be transferred to the aluminum layer using the positive-tone photoresist as a mask. FIG. 5E shows the pattern 310 transferred into the aluminum second mask layer 306. Next, at block 614, the pattern is transferred to the negative-tone photoresist using the aluminum mask material as a mask. FIG. 5F shows the pattern 310 transferred to the negative-tone photoresist first mask material 304. Optionally, the positive-tone photoresist third mask material 308 may be removed after the pattern is transferred from the third mask material to the hybrid mask. The positive-tone photoresist may be removed, for example, by exposing the semiconductor structure to an oxygen plasma.

Finally, the etching of the substrate 302 or other semiconductor structures may be performed using the hybrid mask as a mask for deep etching. At block 614, the pattern is transferred from the hybrid mask to the substrate. FIG. 5G shows the pattern 310 transferred to the substrate 302. Next, at block 616, the negative-tone photoresist may be dissolved in solvent to remove the aluminum layer and the negative-tone photoresist. For example, the semiconductor structure may be placed in an ultrasonic acetone batch. FIG. 5H shows the pattern 310 in the substrate 302 after the hybrid mask is removed.

As a proof of concept, the hybrid dual-layer mask was used to etch through the whole thickness of a Si (100) 4" wafer having a thickness of approximately 500 μm. First, negative-tone PR AZ 5214E with image reversal capability is spun at 3000 rpm for an approximately 1.6 μm thick layer. Pyrolysis bake is then carried out at 100° C. for 60 seconds followed by flood exposure and an image reversal bake at 120° C. for 2 minutes. This makes the complete PR layer insoluble in AZ 726 MIF developer. Next, a thin 200 nm Aluminum layer is sputtered at room temperature followed by positive-tone PR AZ 3027 spun at 3000 rpm to deposit an approximately 4 μm thick layer that is patterned using a 200 mJ/cm$^2$ constant dose and developed in AZ 726 MIF developer for 60 seconds. Then, the Aluminum layer is patterned using the PR mask and metal RIE using a 1500 Watt inductively coupled plasma (ICP), 50 W RF, 20 mTorr, 40 sccm $Cl_2$ and 10 sccm $BCl_3$ at 80° C. Then, the negative tone PR is etched in $O_2$ plasma RIE followed by DRIE of Silicon using $SF_6$ and $C_4F_8$. Finally, the hybrid dual PR/Al mask is removed by immersing in Acetone bath.

A similar approach for patterning a semiconductor substrate has been performed using photoresist (PR)-only mask. The maximum depth achieved before the PR was totally etched during DRIE was 100 μm. On the other hand, the hybrid PR/Al mask persisted during etching of the whole silicon substrate (~525 μm).

To assess the effect of the new process on the etched features and the underlying silicon substrate surface, profiler measurements for surface roughness and scanning electron microscopy (SEM) imaging for feature size measurements, were performed. The results show that the surface of the substrate using only PR and etched during the DRIE process has the highest variations in height and highest surface roughness. This is a challenge when using PR, especially because the process does not have real time feedback to know when the PR is about to be etched through and what is the maximum safe depth using specific PR types. On the other hand, using an Al-only hard mask and wet etching in Gravure or a PR/Al hybrid mask and removal in acetone showed similar results to pristine silicon surface. Gravure is strongly acidic and not recommended for wafers containing fabricated devices and structures. Thus, although the Al-only hard mask may produce results similar to the hybrid mask on a test wafer, the Al-only hard mask process is inappropriate for use on substrates containing electronic circuitry or precursor layers or structures for electronic circuitry.

The demonstrated deep etching using a hybrid mask enables sub-millimeter etching structures, variations of regular etching enabled by choice of any hard mask without the requirement for later removal using strong chemicals or abrasive etching, highly-customized dicing patterns (parallel process and can have customized curves and twists), supporting high-performance bulk mono-crystalline silicon modules on polymers for flexible systems, and is a step forward towards novel flexible packaging of high performance electronics.

Figure 7:
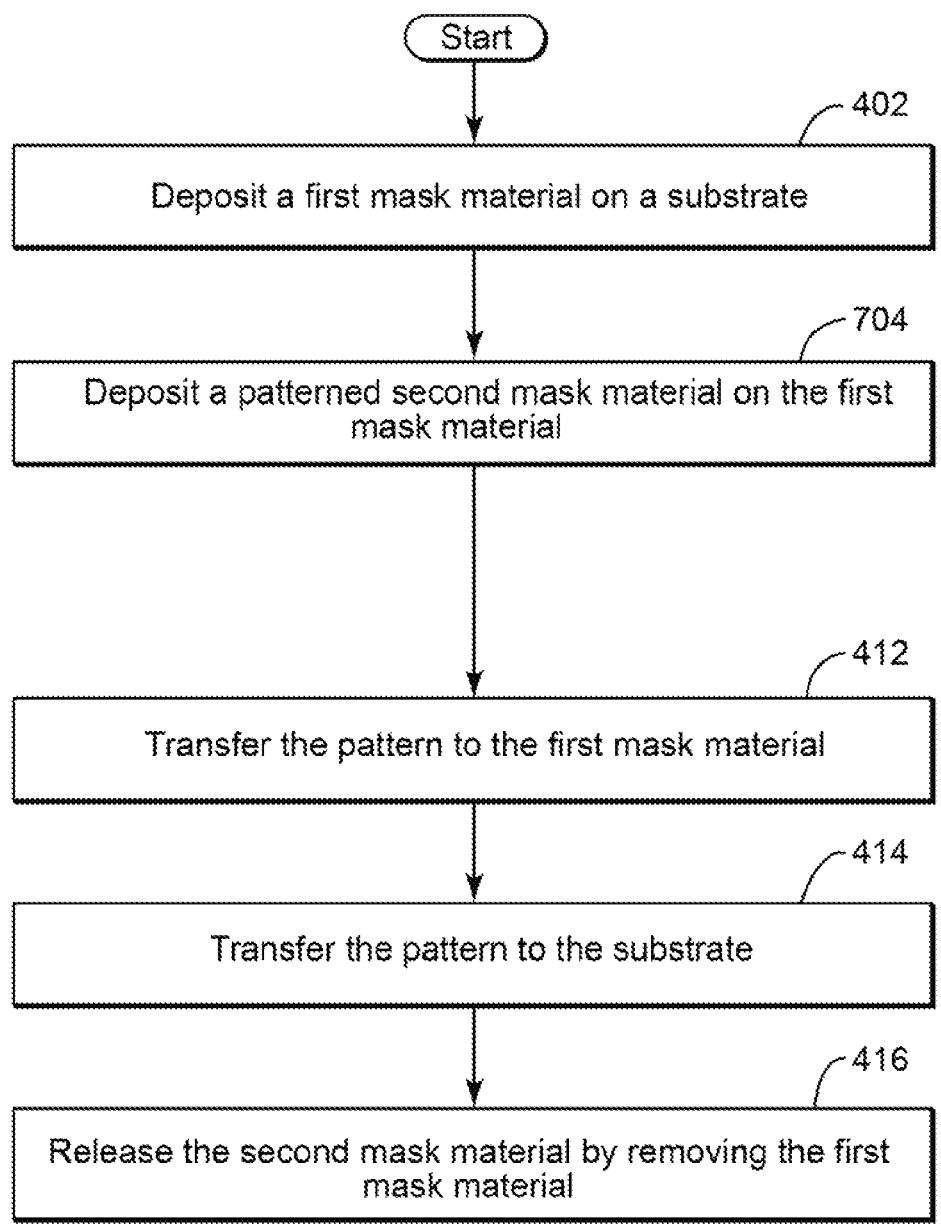
FIG. 7 is a flow chart showing a method of deep etching using a hybrid hard/soft mask according to another embodiment of the disclosure in which the metal is deposited as a pattern.

The semiconductor manufacturing process with a hybrid mask described with reference to FIGS. 3-6 may be varied while retaining the benefits of the hybrid mask. Another manufacturing processing using the hybrid mask is shown in FIG. 7. FIG. 7 is a flow chart showing a method of deep etching using a hybrid hard/soft mask according to another embodiment of the disclosure in which the metal is deposited as a pattern. The process of FIG. 7 involves the deposition of a patterned hard mask layer of the hybrid mask. Thus, a third mask layer used for patterning the second, hard mask material may be omitted. A method 700 begins at block 402 with depositing a first material on a substrate. Then, at block 704, a second mask material may be deposited as a patterned layer on the first mask material. The second mask material may be a hard mask layer of a hybrid mask, and the first mask material may be a soft mask layer of the hybrid mask. The patterned deposition may be performed, for example, by evaporating a metal, such as aluminum, through a stencil mask to form a patterned metal layer on the first mask material. The remaining steps of the processing method 700 may continue similar to those described with reference to FIG. 4. For example, the pattern of the second mask material may be transferred to the first mask material at block 412, transferred to the substrate at block 414, and then the second mask material released by removing the first mask material at block 416.

The hybrid mask and semiconductor manufacturing processes using the hybrid mask, such as those described above with reference to FIGS. 3-7 may be used to form through silicon vias (TSVs). TSVs may extend the entire thickness of a silicon substrate. The TSV may be filled with one or more conductors to allow transfer or power or data from one side of a substrate to another side of the substrate. FIG. 8 is a cross-section showing a through silicon via (TSV) that may be manufacturing using deep etching provided by a hybrid hard/soft mask according to one embodiment of the disclosure. A pattern 310 created in the substrate 302 using the hybrid mask may extend from one side of the substrate 302 to another side of the substrate 302 to form a TSV. A conductor 802 may be deposited in the TSV to provide conduction from one side of the substrate 302 to another side of the substrate 302. Electronics (not shown) on one side of the substrate 302 may then be coupled to the conductor 802 and electronics on the other side of the substrate 302 coupled to the conductor 802, and power or data signals passed through the conductor 802. The TSV may also include multiple conductors 802, such as in a concentric ring configuration, to allow multiple power lines or multiple-bit data signals to be passed from one side of the substrate 302 to the other side of the substrate 302.

Another application of the hybrid mask in semiconductor manufacturing processes uses the hybrid mask for the manufacturing and encapsulation of electronic circuits. One such method will be described with reference to FIGS. 9-10.

FIGS. 9A-9D are illustrations showing a method of encapsulating electronics using deep etching provided by a hybrid hard/soft mask according to one embodiment of the disclosure. FIG. 10 is a flow chart showing a method of preparing electronic device dies using deep etching provided by a hybrid hard/soft mask according to one embodiment of the disclosure. A method 1000 of FIG. 10 begins at block 1002 with forming electronic circuitry on a substrate. FIG. 9A shows electronic circuitry formed on a substrate having a silicon layer 902 and a polymer layer 904. Then, at block 1004, a hybrid mask may be formed on the substrate and electronic circuitry. The hybrid mask may be patterned such that the hybrid mask remains over the electronic circuitry. Thus, during later processing, the substrate materials around the electronics materials may be etched back around the electronic circuitry. Block 1004 may include, for example, blocks 402-410 of FIG. 4. FIG. 9B shows the hybrid mask 905 patterned on the electronic circuitry. Next, at block 1006, the pattern in the hybrid mask is transferred to form a recessed area around the electronic circuitry formed at block 1002. FIG. 9C shows a portion of the substrate 902 recessed around the electronic circuitry. Then, at block 1007, the hybrid mask may be removed, and, at block 1008, bonding pads may be deposited in the recessed area and the bonding pads coupled to the electronic circuitry. FIG. 9C shows bonding pads 906 coupled through wiring 908 to electronic circuitry. Next, at block 1010, the electronic circuitry may be encapsulated. FIG. 9D shows encapsulation 910 deposited around the electronic circuitry and parts or all of the wiring 908 and the bonding pads 906.

Embodiments described above illustrate a deep etching technique using a hybrid dual soft/hard mask layer for harnessing the benefits of easy removal, preserving the interface of underlying substrate, and persisting through long duration etches. Negative-PR/Al metal layer hybrid masks have been used to demonstrate the capabilities of the technique, and properties of the etched features are at least as good as those obtained using only a hard and present none of the issues involved with using only a hard mask. These processing techniques can be adapted towards realization of future flexible and stretchable electronics and flexible packaging techniques. Further, the deep etching ability described above may be employed in bulk micromachining to fabricate micro-motors, electrostatic resonators, optical filters, micro-lenses, thermal actuators, MEMS switches, capacitive sensors and actuators, and flexible and stretchable electronic devices.

The schematic flow chart diagrams of FIG. 3, FIG. 4, FIG. 5, FIG. 6, FIG. 7, and FIG. 10 are generally set forth as a logical flow chart diagrams. As such, the depicted order and labeled steps are indicative of aspects of the disclosed methods. Other steps and methods may be conceived that are equivalent in function, logic, or effect to one or more steps, or portions thereof, of the illustrated methods. Additionally, the format and symbols employed are provided to explain the logical steps of the methods and are understood not to limit the scope of the methods. Although various arrow types and line types may be employed in the flow chart diagram, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   depositing a first mask material on a substrate;
   depositing a second mask material on the first mask material;
   depositing a third mask material on the second mask material;
   patterning the third mask material with a pattern corresponding to one or more trenches for transfer to the substrate;
   transferring the pattern from the third mask material to the second mask material;
   transferring the pattern from the second mask material to the first mask material; and
   transferring the pattern from the first mask material to the substrate while maintaining the first, second, and third masks on the substrate.

2. The method of claim 1, further comprising removing the first mask material, the second mask material, and the third mask material by releasing the second mask material and the third mask material by dissolving the first mask material.

3. The method of claim 1, wherein the first mask material comprises a non-metallic material, the second mask material comprises a metallic material, and the third mask material comprises a non-metallic material.

4. The method of claim 3, wherein the first mask material comprises a negative tone photoresist and the third mask material comprises a positive tone photoresist.

5. The method of claim 1, wherein the step of transferring the pattern from the first mask material to the substrate comprises forming one or more through silicon vias, (TSVs).

6. The method of claim 1, wherein the step of transferring the pattern from the first mask material to the substrate comprises etching an entire thickness of the substrate.

7. The method of claim 1, wherein the step of transferring the pattern from the first mask material to the substrate comprises etching one or more trenches around electronic components.

8. The method of claim 7, further comprising forming bonding pads in the one or more trenches around electronic components.

9. The method of claim 8, further comprising coupling the bonding pads to the electronic components; and encapsulating the electronic components.

10. The method of claim 9, wherein the steps of forming the bonding pads, coupling the bonding pads, and encapsulating the electronic components comprises forming a flexible electronics package.

11. A method, comprising:
    forming electronic circuitry on a substrate;
    forming a hybrid mask on the substrate and the electronic circuitry, wherein the hybrid mask includes at least a patterned soft mask material formed on the substrate and the electronic circuitry and a patterned hard mask material formed on the patterned soft mask material;
    transferring a pattern of the patterned soft mask material and the patterned hard mask material to the substrate while maintaining the patterned soft mask material and the patterned hard mask material on the substrate; and
    removing the hybrid mask from the substrate and the electronic circuitry.

12. The method of claim 11, wherein the transfer of the pattern to the substrate forms a recessed area in the substrate around the electronic circuitry.

13. The method of claim 12, further comprising:
    depositing bonding pads in the recessed area in the substrate.

14. The method of claim 13, further comprising:
    couple the bonding pads to the electronic circuitry.

15. The method of claim 14, further comprising:
    encapsulating the electronic circuitry.

16. A method, comprising:
    depositing a first mask material on a substrate;
    depositing a patterned second mask material on the first mask material;
    transferring a pattern of the patterned second mask material to the first mask material;
    transferring the pattern to the substrate while maintaining the patterned second mask material and the first mask material on the substrate; and
    releasing the second mask material from the substrate by removing the first mask material from the substrate.

17. The method of claim 16, wherein the first mask material is a soft mask material.

18. The method of claim 17, wherein the second mask material is a hard mask material.

19. The method of claim 16, wherein the deposition of the patterned second mask material comprises:
    evaporating metal through a stencil mask.

20. The method of claim 16, wherein the release of the first mask material from the substrate comprises:
    immersing the first mask material in an acetone bath.

* * * * *